(12) United States Patent
Murakami et al.

(10) Patent No.: US 8,535,857 B2
(45) Date of Patent: Sep. 17, 2013

(54) DYE-CONTAINING NEGATIVE CURABLE COMPOSITION, COLOR FILTER, METHOD OF PRODUCING THE SAME, AND SOLID-STATE IMAGE SENSOR

(75) Inventors: Yosuke Murakami, Haibara-gun (JP); Tomotaka Tsuchimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1010 days.

(21) Appl. No.: 12/318,189

(22) Filed: Dec. 23, 2008

(65) Prior Publication Data
US 2009/0170015 A1  Jul. 2, 2009

(51) Int. Cl.
*G03F 7/00* (2006.01)
*G03F 7/004* (2006.01)
*G03F 7/027* (2006.01)
*G03F 7/028* (2006.01)

(52) U.S. Cl.
USPC .......... 430/7; 430/270.1; 430/281.1; 430/913

(58) Field of Classification Search
None
See application file for complete search history.

(56) References Cited

U.S. PATENT DOCUMENTS

| | | | |
|---|---|---|---|
| 3,864,133 A | 2/1975 | Hisamatsu et al. | |
| 4,038,257 A | 7/1977 | Suzuki et al. | |
| 2005/0186504 A1 | 8/2005 | Matsumoto | |
| 2007/0072096 A1 | 3/2007 | Takakuwa et al. | |

FOREIGN PATENT DOCUMENTS

| | | |
|---|---|---|
| EP | 1850178 A2 | 10/2007 |
| EP | 1970759 A1 | 9/2008 |
| JP | 48-41708 B | 12/1973 |
| JP | A 8-62841 | 3/1996 |
| JP | A 2000-321763 | 11/2000 |
| JP | 2004002631 A | 1/2004 |
| JP | 2006-78602 A | 3/2006 |
| JP | A 2006-119441 | 5/2006 |
| JP | 2006243173 A | 9/2006 |

OTHER PUBLICATIONS

Translation of JP-2004-002631(Jan. 2004).*
EP communication, dated May 29, 2009, issued in corresponding EP Application No. 08172752.1.

* cited by examiner

*Primary Examiner* — Amanda C. Walke
(74) *Attorney, Agent, or Firm* — SOLARIS Intellectual Property Group, PLLC

(57) ABSTRACT

The invention provides a dye-containing negative curable composition containing at least a dye soluble in an organic solvent, a photopolymerization initiator, a photopolymerizable compound containing an amine structure, and an organic solvent; a color filter formed from the dye-containing negative curable composition; a method of producing the color filter; and a solid-state image sensor.

17 Claims, 1 Drawing Sheet

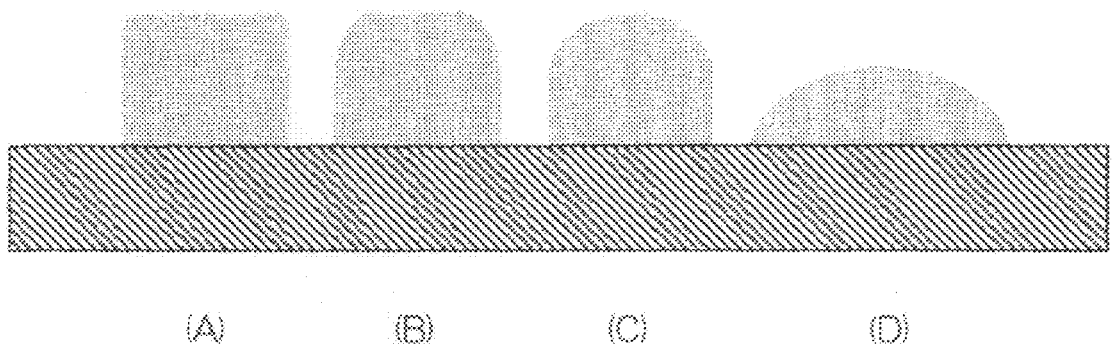

DYE-CONTAINING NEGATIVE CURABLE COMPOSITION, COLOR FILTER, METHOD OF PRODUCING THE SAME, AND SOLID-STATE IMAGE SENSOR

CROSS-REFERENCE TO RELATED APPLICATION

This application claims priority under 35 USC 119 from Japanese Patent Application No. 2007-340294, the disclosure of which is incorporated by reference herein.

BACKGROUND OF THE INVENTION

1. Field of the Invention

The present invention relates to a dye-containing negative curable composition, a color filter using the dye-containing negative curable composition, a method of producing the same, and a solid-state image sensor.

2. Description of the Related Art

A pigment dispersion method is widely known as a method of producing a color filter used in liquid crystal displays (LCD) and solid-state image sensors (CCD, CMOS and the like).

The pigment-dispersion method is a method of producing a color filter by a photolithographic method using a colored photosensitive composition having a pigment dispersed in various photosensitive compositions. Since patterning is conducted by the photolithographic method, this method is considered to be suitable for producing a large-sized color filter having high positional accuracy and high resolution. In the pigment-dispersion method, a color filter is obtained by repeating a process for each color, the process including forming a coating film by applying a photo-sensitive composition onto a glass substrate by a spin-coater or a roll-coater, forming a colored pixel by exposing the coating film to light in a pattern-wise manner, and developing the exposed coating film.

In preparation of a display device such as an LCD, CCD or CMOS using a color filter including a pigment, reduction in particle size of the pigment has been demanded from the viewpoint of improving the contrast (for example, see Japanese Patent Application Laid-Open (JP-A) No. 2000-321763). This is because a polarizing axis may be rotated by scattering of light, double-refraction, or the like due to the pigment. When the size of the pigment is not small enough, light may be scattered and absorbed, light transmittance may be lowered, and the contrast may be lowered. Moreover, curing sensitivity upon pattern-exposure may be degraded.

Demands for further increase in resolution have recently been particularly high in a color filter used in solid-state image sensors. However, further improvements in resolution have become difficult to achieve in a conventional pigment-dispersion system, since there are problems such as occurrence of color irregularities due to coarse particles of a pigment. Therefore, the pigment-dispersion system has been unsuitable for applications in which a fine pattern with a pixel size of as small as 1.5 to 3.0 μm square is required, such as solid-state image sensors.

With the view of overcoming the above situation, a technique of using a dye instead of a pigment has been proposed. Further, in recent years, reduction in thickness of a colored pattern (for example, 1 μm or less) has been required for improving image quality by increasing light-harvesting properties and light-color separating properties. In order to reduce the thickness of the colored pattern, concentration of a dye has to be increased in view of maintaining color density. On the other hand, as the concentration of the dye increases, sensitivity may greatly decrease, the pattern may easily exfoliate in a region at which the exposure amount is low, or the shape of the pattern may be distorted upon baking at high temperature after the formation of the pattern, thereby failing to maintain the originally formed shape of the pattern.

In order to overcome the above-mentioned problems, a method in which the amount of an initiator is increased has been known.

As techniques relevant to the above, JP-A No. 2006-119441 discloses a photothermal polymerizable composition containing a polymerizable compound having a triazine skeleton and a heteroalicyclic block isocyanate compound having a triazine skeleton in combination. Further, JP-A No. 8-62841 discloses a photosensitive resin composition containing isocyanuric acid ethylene oxide-modified tri(meth)acrylate as a photopolymerizable compound.

However, when the amount of the initiator is increased, generation of a remnant may be significant. Further, the shape of the pattern may be distorted to a tapered shape upon heating at high temperature, such as post-baking, thereby failing to obtain a rectangular shape. This distortion tends to be significant particularly in the formation of a fine pattern of 2 μm square or less (for example, a Bayer pattern of 1.5 μm square or less).

Moreover, in the techniques of using a composition including a compound having an imide structure containing a carbonyl group, such as the aforementioned heteroalicyclic block isocyanate compound or isocyanuric acid ethylene oxide-modified tri(meth)acrylate, distortion of a pattern due to heating cannot be prevented. In particular, it is difficult to form a fine pattern having a size of as small as 2 μm square or less with a desired rectangular shape.

The present invention has been made in view of the above problems, and provides a dye-containing negative curable composition that can suppress distortion of a pattern caused by heating after patterning, a color filter that can suppress distortion of a pattern caused by heating and maintain a favorable shape (in particular, a rectangular shape for solid-state image sensors), a method of producing the color filter, and a solid-state image sensor having excellent color reproducibility.

The present invention has been made based on the findings that when a polymerizable compound, which serves to cure the composition, has basicity and a structure capable of interacting with an acidic group or an ester group in the composition, tolerance of the composition against heat that is applied after exposure and curing (patterning) can be improved.

SUMMARY OF THE INVENTION

One aspect of the present invention provides a dye-containing negative curable composition comprising at least a dye soluble in an organic solvent, a photopolymerization initiator, a photopolymerizable compound containing an amine structure, and an organic solvent.

BRIEF DESCRIPTION OF THE DRAWING

FIG. 1 is a drawing showing evaluation criteria for the pattern profile.

DETAILED DESCRIPTION OF THE INVENTION

In the following, details of the dye-containing negative curable composition, the color filter using the dye-containing negative curable composition, the method of producing the same, and the solid-state image sensor according to the present invention will be described.

(A) Dye Soluble in Organic Solvent

The negative curable composition of the present invention contains at least one dye that is soluble in an organic solvent. The dye that is soluble in an organic solvent that may be included in the negative curable composition of the present invention is not particularly limited, but may be selected from kwon dyes that are used in conventional color filters.

Examples of these known dyes include dyes described in JP-A Nos. 64-90403, 64-91102, 1-94301 and 6-11614, JP No. 2592207, U.S. Pat. Nos. 4,808,501, 5,667,920 and 5,059,500, and JP-A Nos. 5-333207, 6-35183, 6-51115 and 6-194828.

Examples of the chemical structure of the dyes that are soluble in an organic solvent include triphenylmethane series, anthraquinone series, benzylidene series, oxonol series, cyanine series, phenothiazine series, pyrazole azo series, anilino azo series, pyrazolotriazole azo series, pyridone azo series, pyrrolopyrazole azomethine series, xanthene series, phthalocyanine series, benzopyrane series, indigo series, and anthrapyridone series. Among these, pyrazole azo series, anilino azo series, pyrazolotriazole azo series, pyridone azo series, anthraquinone series, and anthrapyridone series are particularly preferable.

Further, in the case of a resist system that can be patterned by water or alkaline development, acidic dyes and/or derivatives thereof may favorably be used as dyes that are soluble in an organic solvent in view of complete removal of a binder and/or a dye by development. In addition, direct dyes, basic dyes, mordant dyes, acid mordant dyes, azoic dyes, dispersive dyes, oil soluble dyes, foodstuff dyes and/or derivatives thereof may favorably be used as dyes that are soluble in an organic solvent in the present invention.

Among these, dyes that are soluble in an organic solvent are preferably alkali-soluble in view of carrying out favorable alkali development and simple pattern-formation. Further, acidic dyes and/or derivatives thereof are particularly preferable in view of conducting favorable patterning by alkali development and suppressing distortion of the pattern upon heating after exposure and curing (in particular, post baking at 200° C. or more) by interaction with a later-described photopolymerizable compound having an amine structure.

The acidic dyes and/or derivatives are not particularly limited as long as they have an acidic group such as a sulfonic group, a carboxyl group or a phenolic hydroxyl group, and may be selected in consideration of necessary properties such as solubility with respect to an organic solvent or a developer, salt formation with a basic compound, light absorbance, interaction with other components in the curable composition, light resistance and heat resistance.

In the following, specific examples of the above acidic dyes are described. However, the present invention is not limited thereto.

Acid Alizarin Violet N;
Acid Black 1, 2, 24 and 48;
Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335 and 340;
Acid Chrome Violet K;
Acid Fuchsin;
Acid Green 1, 3, 5, 9, 16, 25, 27, 50, 58, 63, 65, 80, 104, 105, 106 and 109;
Acid Orange 6, 7, 8, 10, 12, 26, 50, 51, 52, 56, 62, 63, 64, 74, 75, 94, 95, 107, 108, 169 and 173;
Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422 and 426;
Acid Violet 6B, 7, 9, 17 and 19;
Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243 and 251;
Direct Yellow 2, 33, 34, 35, 38, 39, 43, 47, 50, 54, 58, 68, 69, 70, 71, 86, 93, 94, 95, 98, 102, 108, 109, 129, 136, 138 and 141;
Direct Orange 34, 39, 41, 46, 50, 52, 56, 57, 61, 64, 65, 68, 70, 96, 97, 106 and 107;
Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246 and 250;
Direct Violet 47, 52, 54, 59, 60, 65, 66, 79, 80, 81, 82, 84, 89, 90, 93, 95, 96, 103 and 104;
Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275 and 293;
Direct Green 25, 27, 31, 32, 34, 37, 63, 65, 66, 67, 68, 69, 72, 77, 79 and 82;
Mordant Yellow 5, 8, 10, 16, 20, 26, 30, 31, 33, 42, 43, 45, 56, 50, 61, 62 and 65;
Mordant Orange 3, 4, 5, 8, 12, 13, 14, 20, 21, 23, 24, 28, 29, 32, 34, 35, 36, 37, 42, 43, 47 and 48;
Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94 and 95;
Mordant Violet 2, 4, 5, 7, 14, 22, 24, 30, 31, 32, 37, 40, 41, 44, 45, 47, 48, 53 and 58;
Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84;
Mordant Green 1, 3, 4, 5, 10, 15, 19, 26, 29, 33, 34, 35, 41, 43 and 53;
Food Yellow 3; and derivatives of these dyes.

Among the above acidic dyes,
Acid Black 24;
Acid Blue 23, 25, 29, 62, 80, 86, 87, 92, 138, 158, 182, 243 and 324:1;
Acid Orange 8, 51, 56, 63 and 74;
Acid Red 1, 4, 8, 34, 37, 42, 52, 57, 80, 97, 114, 143, 145, 151, 183, 217 and 249;
Acid Violet 7;
Acid Yellow 17, 25, 29, 34, 42, 72, 76, 99, 111, 112, 114, 116, 134, 155, 169, 172, 184, 220, 228, 230, 232 and 243;
Acid Green 25; and derivatives of these dyes are preferable.

Further, other than the above, azo series, xanthene series and phthalocyanine series acidic dyes are also preferable, and C.I. Solvent Blue 44 and 38; C.I. Solvent Orange 45; Rhodamine B; Rhodamine 110; 3-[(5-chloro-2-phenoxyphenyl)hydrazono]-3,4-dihydro-4-oxo-5-[(phenylsulfonyl)amino]-2,7-naphthalenedisulfonic acid or the like and derivatives of these acidic dyes may favorably be used.

Inorganic salts of acidic dyes having an acidic group such as a sulfonic group, carboxyl group or the like, salts of the acidic dye and a nitrogen-containing compound, amide compounds such as sulfonamide derivatives of the acidic dyes, or the like, may be used as the above derivatives of the acidic dyes. The derivatives are not particularly limited as long as they can be dissolved in a curable composition when it is prepared in the form of a solution, and may be selected in consideration of necessary properties such as solubility with respect to an organic solvent or a developer, light absorbance, interaction with other components in the curable composition, light resistance and heat resistance.

Methods of forming the above-mentioned salts of an acidic dye and a nitrogen-containing compound may be effective in improving the solubility of an acidic dye (imparting solubility to an organic solvent) or in improving heat resistance and light resistance.

A nitrogen-containing compound that forms a salt with an acidic dye and a nitrogen-containing compound that forms an amide bond with an acidic dye are selected in consideration of the properties of the salt or amide compound such as the solubility with respect to an organic solvent or a developer, the salt formation, the light absorbance and chromatic valence of the dye, the interaction with other components in the curable composition, the light resistance and heat resistance as a colorant, and the like. When selected only in view of light absorbance and chromatic valence, it is preferable that the molecular weight of the nitrogen-containing compound is as low as possible, more preferably 300 or less, yet more preferably 280 or less, and particularly preferably 250 or less.

The molar ratio (referred to as "n" in the following) of the nitrogen-containing compound and the acidic dye (nitrogen-containing compound/acidic dye) in the salt of an acidic dye and a nitrogen-containing compound is explained. n is a value determined by the molar ratio of the acidic dye molecule and the nitrogen-containing compound (amine compound) as a counter ion, and may be freely selected in accordance with the conditions for acidic dye-amine compound salt formation. Specifically, a numerical value of $0<n\leq 5$ is commonly used with respect to the number of acidic functional groups in the acidic dye in practical applications, and is selected after consideration of necessary properties such as solubility with respect to an organic solvent or a developer, salt formation, light absorbance, interaction with other components in the curable composition, light resistance and heat resistance. When selected only in view of light absorbance, n is preferably a numerical value satisfying $0<n\leq 4.5$, more preferably a numerical value satisfying $0<n\leq 4$ and particularly preferably a numerical value satisfying $0<n\leq 3.5$.

Since the above acidic dyes are constituted as acidic dyes by the introduction of an acidic group into their structure, they may be made into non-acidic dyes by changing the substituent.

While there are cases where acidic dyes act favorably in alkaline development, there are also cases where over-development occurs, and thus non-acidic dyes are favorably used. Dyes such as the acidic dyes exemplified above but without an acidic group may be favorably used as the non-acidic dyes.

When these dyes compose complementary colors of yellow, magenta and cyan, dyes of the respective single colors are preferably used for each color, and when they compose primary colors of red, green and blue, a combination of two or more dyes is preferably used for each color in view of the hue. It is preferable to make up a primary color system by combining two or more dyes, for the dye that is soluble in an organic solvent.

When two or more of the above dyes soluble in an organic solvent are combined, it is preferable to use a mixture of at least two dyes having different absorption properties as the combination.

An example of such absorption properties is the maximum absorption wavelength. In this case, for example, a combination of dyes having maximum absorption wavelengths that differ by 50 nm-250 nm is preferable, and a combination of dyes having maximum absorption wavelengths that differ by 50 nm-200 nm is more preferable.

Examples of a preferable combination of dyes soluble in an organic solvent include:

a combination of Valifast Yellow 1101 and Acid Red 57 (mass ratio 2:3);

a combination of Direct Yellow 33 and Direct Green 27 (mass ratio 2:3); and a combination of Mordant Violet 40 and Direct Green 69 (mass ratio 1:2).

The content of the dye that is soluble in an organic solvent in the negative curable composition containing differs according to the dye, but may be selected from the range of 10-90 mass % with respect to the total solid content in the composition. While it is effective that the amount of the dye in the composition is large (the amount of other components such as a photopolymerizable compound and a photopolymerization initiator is small), it is difficult to achieve the effects of the present invention when the amount of the dye in the composition is too large (the amount of other components such as a photopolymerizable compound or a photopolymerization initiator is too small). From the viewpoints of further suppressing distortion caused by a heat treatment after patterning (exposure, development or the like) and improving adhesion of the cured pattern to a substrate, the amount of the dye is more preferably from 40 to 90 mass %, yet more preferably from 50 to 80 mass %, and particularly preferably from 55 to 70 mass %.

When two or more of dyes are used in combination, the amount of the dye that is combined in the smallest amount is preferably at least 10% with respect to the total amount of the dyes as 100%, in view of the hue.

(B) Photopolymerization initiator

The dye-containing negative curable composition of the present invention includes at least one kind of photopolymerization initiator. The photopolymerization initiator serves to cure the composition by reacting with the later-descried photopolymerizable compound including an amine structure, or reacting with other polymerizable monomers in some cases. The photopolymerization initiator in the present invention is not particularly limited as long as it can polymerize the photopolymerizalbe compound including an amine structure, but is preferably selected in view of its properties, initiation efficiency, absorption wavelength, availability, cost and the like.

Examples of the photopolymerization initiator include at least one active halide selected from halomethyloxadiazole compounds and halomethyl-s-triazine compounds, 3-aryl substituted coumarin coumpounds, lophine dimers, benzophenone compounds, acetophenone compounds and derivatives thereof, cyclopentadiene-benzene-iron complexes and salts thereof, and oxime compounds.

Examples of an active halide that is a halomethyloxadiazole compound include 2-halomethyl-5-vinyl-1,3,4-oxadiazole compounds and the like as described in Japanese Patent Application Publication (JP-B) No. 57-6096, 2-trichloromethyl-5-styryl-1,3,4-oxadiazole, 2-trichloromethyl-5-(p-cyanostryryl)-1,3,4-oxadiazole and 2-trichloromethyl-5-(p-methoxystyryl)-1,3,4-oxadiazole.

Examples of an active halide that is a halomethyl-s-triazine compound include vinyl-halomethyl-s-triazine compounds as described in JP-B No. 59-1281, 2-(naphth-1-yl)-4,6-bis (halomethyl)-s-triazine compounds as described in JP-A No. 53-133428 and 4-(p-aminophenyl)-2,6-bis(halomethyl)-s-triazine compounds.

Specific examples of the halomethyl-s-triazine compounds include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis(trichloromethyl)-s-triazine, 2-(4-methoxy-naphth-1-yl)-4,6-bis(trichloromethyl)-s-triazine, 2-(4-ethoxy-naphth-1-yl)-4,6-bis(trichloromethyl)-s-triazine, 2-(4-butoxy-naphth-1-yl)-4,6-bis(trichloromethyl)-s-triazine, 2-[4-(2-methoxyethyl)-naphth-1-yl]-4,6-bis(trichloromethyl)-s-triazine, 2-[4-(2-ethoxyethyl)-naphth-1-yl]-4,6-bis(trichloromethyl)-s-triazine, 2-[4-(2-butoxyethyl)-naphth-1-yl]-4,6-bis(trichloromethyl)-s-triazine, 2-(2-methoxy-naphth-1-yl)-4,6-bis(trichloromethyl)-s-triazine, 2-(6-methoxy-5-methyl-naphth-2-yl)-4,6-bis(trichloromethyl)-s-triazine, 2-(6-methoxy-naphth-2-yl)-4,6-bis(trichloromethyl)-s-triazine, 2-(5-methoxy-naphth-1-yl)-4,6-bis(trichloromethyl)-s-triazine, 2-(4,7-dimethoxy-naphth-1-yl)-4,6-bis(trichloromethyl)-s-triazine, 2-(6-ethoxy-naphth-2-yl)-4,6-bis(trichloromethyl)-s-triazine, 2-(4,5-dimethoxy-naphth-1-yl)-4,6-bis(trichloromethyl)-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)animophenyl]-2,6-di(trichloromethyl)-s-triazine, 4-[m-bromo-p-N,N-di(ethoxycarbonylmethyl)animophenyl]-2,6-di(trichloromethyl)-s-triazine, 4-[m-chloro-p-N,N-di(ethoxycarbonylmethyl)animophenyl]-2,6-di(trichloromethyl)-s-triazine, 4-[m-fluoro-p-N,N-di(ethoxycarbonylmethyl)animophenyl]-2,6-di(trichloromethyl)-s-triazine, 4-[o-bromo-p-N,N-di(ethoxycarbonylmethyl)animophenyl]-2,6-di(trichloromethyl)-s-triazine, 4-[o-chloro-p-N,N-di(ethoxycarbonylmethyl)animophenyl]-2,6-di(trichloromethyl)-s-triazine, 4-[o-fluoro-p-N,N-di(ethoxycarbonylmethyl)animophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylanimophenyl)-2,6-di(trichloromethyl)-s-triazine, 4-(m-chloro-p-N-ethoxycarbonylmethylanimophenyl)-2,6-di(trichloromethyl)-s-triazine, 4-(m-fluoro-p-N-ethoxycarbonylmethylanimophenyl)-2,6-di(trichloromethyl)-s-triazine, 4-(o-bromo-p-N-ethoxycarbonylmethylanimophenyl)-2,6-di(trichloromethyl)-s-triazine, 4-(o-chloro-p-N-ethoxycarbonylmethylanimophenyl)-2,6-di(trichloromethyl)-s-triazine, 4-(o-fluoro-p-N-ethoxycarbonylmethylanimophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

Other examples of the photopolymerization initiator that may be used include the TAZ series produced by Midori Kagaku Co., Ltd. (for example, TAZ-107, TAZ-110, TAZ-104, TAZ-109, TAZ-140, TAZ-204 TAZ-113 and TAZ-123), the T series produced by Panchim Ltd. (for example, T-OMS, T-BMP, T-R and T-B), the IRGACURE® series (for example, IRGACURE 651, IRGACURE 184, IRGACURE 500, IRGACURE 1000, IRGACURE 149, IRGACURE 819 and IRGACURE 261) and DALOCURE® series (for example, DALOCURE 1173) produced by Ciba Specialty Chemicals, 4,4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimers, 2-(o-fluorophenyl)-4,5-diphenylimidazolyl dimers, 2-(o-methoxyphenyl)-4,5-diphenylimidazolyl dimers, 2-(p-methoxyphenyl)-4,5-diphenylimidazolyl dimers, 2-(p-dimethoxyphenyl)-4,5-diphenylimidazolyl dimers, 2-(2,4-dimethoxyphenyl)-4,5-diphenylimidazolyl dimers, 2-(p-methylmercaptophenyl)-4,5-diphenylimidazolyl dimers, and benzoin isopropyl ether.

Among these photopolymerization initiators, oxime compounds are preferable and, for example, 2-(O-benzoyloxime)-1-[4-(phenylthio)phenyl]-1,2-octanedione (a product from Ciba Japan, K.K.), and 1-(O-acetyloxime)-1-[9-ethyl-6-(2-methylbenzoyl)-9H-carbazol-3-yl]ethanone (a product from Ciba Japan, K.K.) are particularly preferable.

Further, a sensitizer and/or a light stabilizer may be used together with these photopolymerization initiators.

Specific examples thereof include benzoin, benzoin methyl ether, 9-fluorenon, 2-chloro-9-fluorenon, 2-methyl-9-fluorenon, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino)phenylstyrylketone, p-(dimethylamino)phenyl-p-methylstyrylketone, benzophenone, p-(dimethylamino) benzophenone (or Michler's ketone), p-(diethylamino) benzophenone, benzoanthrone, benzothiazole compounds as disclosed in JP-B No. 51-48516, and TINUVIN 1130 and TINUVIN 400.

In addition to the above photopolymerization initiators, other known photopolymerization initiators may be used in the negative curable composition of the present invention.

Specific examples include vicinal polyketol aldonil compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, combinations of triaryl imidazole dimers with p-aminophenyl ketone disclosed in U.S. Pat. No. 3,549,367 and combinations of benzothiazole compounds with trihalomethyl-s-triazine compounds disclosed in JP-B No. 51-48516.

The content amount of the photopolymerization initiator with respect to the total solid content (mass) of the photopolymerizable compound (and other polymerizable compounds in some cases) is preferably from 0.01 mass % to 50 mass %, more preferably from 1 mass % to 30 mass %, and particularly preferably from 1 mass % to 20 mass %. When the content amount of the photopolymerization initiator is 0.01 mass % or more, polymerization and curing can favorably proceed, and when 50 mass % or less, degradation in film strength due to a small molecular weight (although the polymerization degree is increased) can be avoided.

(C) Photopolymerizable Compound Containing Amine Structure

The dye-containing negative curable composition of the present invention includes at least one kind of photopolymerizable compound containing an amine structure. The photopolymerizable compound, containing an amine structure and exhibiting basicity, interacts with an acidic group (such as a carboxylic group) or an ester group in the composition, for example, with an acidic group or an ester group included in a dye that is soluble in an organic solvent (in particular, an acidic dye), thereby imparting heat resistance to a cured pattern after being subjected to exposure and development. Consequently, even when a heat treatment (such as post-baking at a temperature of as high as 200° C.) is conducted, distortion of the pattern can be suppressed and a pattern image for a color filter having a favorable shape can be formed while being highly cured at high temperature. In particular, in the case of forming a color filter for solid-state image sensors, a pattern image having a favorable rectangular profile with little tapering due to heating can be formed. Moreover, adhesion of the formed pattern to a substrate or the like can be improved, and occurrence of image defects due to exfoliation of the pattern can be suppressed.

The "amine structure" of the photopolymerizable compound in the present invention refers to a structure that includes a nitrogen atom having an unshared electron pair and exhibits basicity, which may be any of primary amine, secondary amine and tertiary amine. However, the amine structure does not include an amide structure or an imide structure in which a carbonyl group is directly bonded to a nitrogen atom.

Among the photopolymerizable compounds having an amine structure, compounds that may be represented by the following Formula (1) having a tertiary amine structure is preferable, since the structure is stable in the compound and is not easily added to an ethyleneic unsaturated double bond, and exhibits high basicity and interaction properties.

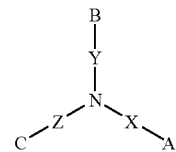

Formula (1)

In Formula (1), X, Y and Z each independently represent a divalent group containing an alkylene group to be bonded to the nitrogen atom, or a single bond.

The alkylene group contained in the divalent group is not particularly limited, and may be either linear or branched, and may have a substituent or may.not. Examples of the substituent include an alkyl group having 1 to 30 carbon atoms (such as a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, and a 2-ethylhexyl group), an alkenyl group having 2 to 30 carbon atoms (such as an ethylenyl group, a propenyl group, a vinyl group, an allyl group, a styryl group, a butenyl group, and a hexenyl group), an aryl group having 6 to 30 groups (such as a phenyl group, a biphenyl group, a 1-naphtyl group, a 2-naphtyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, a m-tolyl group, a p-tolyl group, a xylyl group, an o-cumenyl group, a m-cumenyl group, a p-cumenyl group, a mesityl group, a pentalenyl group, a binaphtalenyl group, a ternaphtalenyl group, a quaternaphtalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphtylenyl group, a heptaphenyl group, a heptacenyl group, a pyranthrenyl group, and an ovalenyl group), a halogen atom (such as a fluorine atom, a chlorine atom, a bromine atom and an iodine atom), an alkoxy group (such as a methoxy group, an ethoxy group and a tert-butoxy group), and an aryloxy group (such as a phenoxy group and a p-tolyloxy group), an alkoxycarbonyl group (such as a methoxycarbonyl group, a butoxycarbonyl group and a phenoxycarbonyl group), an acyloxy group (such as an acetoxy group, a propionyloxy group and a benzoyloxy group), an acyl group (such as an acetyl group, a benzoyl group, an isobutylyl group, a methoxyalyl group, an acrylic group and a methacrylic group), an alkylsulfanyl group (such as a methylsulfanyl group and a tert-butylsulfanyl group), an arylsulfanyl group (such as a phenylsulfanyl group and a p-tolylsulfanyl group), and a monovalent substituent (such as a hydroxyl group, a formyl group, a mercapto group, a nitro group, a cyano group, a trifluoromethyl group, and a later-described monovalent terminal group represented by A, B or C in Formula (1)). These substituents may be further substituted by a substitutent described above.

Specific examples of the alkylene group include a methylene group, an ethylene group, a propylene group, a butylene group, a hexylene group and a heptylene group. Among these, an alkylene group having 1 to 6 carbon atoms is preferable, and an ethylene group is particularly preferable, in view of achieving high reactivity and high developability.

Examples of the "divalent group containing an alkylene group to be bonded to the nitrogen atom" include an alkylene group, an alkyleneoxy group, an alkyleneoxycarbonyl group, a urea group, a urethane group, an ester group, an aryleneoxy group, and a group in which at least two of these groups are bonded together. Among these, an alkylene group, an alkyleneoxy group, a urea group, an alkyleneoxycarbonyl group, and a group in which at least two of these groups are bonded together are preferable in view of achieving high reactivity and high developability.

A, B and C in Formula (1) each independently represent a monovalent terminal group. In formula (1), at least one of A, B or C includes an ethylenic unsaturated double bond. By including a polymerizable group in at least one of the terminal group represented by A, B or C, curing properties can be imparted to the composition to enable to form a pattern that is cured by polymerization reaction.

Examples of the monovalent terminal group that does not include an ethylenic unsaturated double bond represented by A, B or C are not particularly limited, and include an alkyl group, an aryl group, a halogen group, an alkoxy group, an aryloxy group, an alkoxycarbonyl group, an acyloxy group, an acyl group, an arylsulfanyl group, a hydroxyl group, a mercapto group, a sulfonic group, a mesyl group, a p-toluenesulfonyl group, an amino group, a nitro group, and a cyano group. Among these, an alkyl group having carbon atoms of 1 to 30, an aryl group and a hydroxyl group are particularly preferable. The monovalent terminal group that includes an ethylenic unsaturated double bond is preferably an alkenyl group with or without a substitutuent, such as an alkyl group. The alkenyl group is preferably an alkenyl group having 2-10 carbon atoms (further preferably 2-4 carbon atoms) with or without a substituent, and particularly preferably a vinyl group or a propenyl group.

It is preferable that two or more of the terminal groups represented by A, B or C include an ethylenic unsaturated double bond, and it is particularly preferable that all of the terminal groups represented by A, B and C include an ethylenic unsaturated double bond. Moreover, the number of ethylenic unsaturated double bond in the molecule of the compound represented by Formula (1) is preferably 1 to 10, more preferably 2 to 8, and particularly preferably 3 to 6, for the reasons as described above.

The molecular weight of the photopolymerizable compound containing an amine structure (including a compound represented by Formula (1)) is preferably from 200 to 1,500, and more preferably from 250 to 800, in view of solubility in a solution.

The following are specific examples of the photopolymerizable compound containing an amine structure (including a compound represented by Formula (1)). However, the present invention is not limited to these examples.

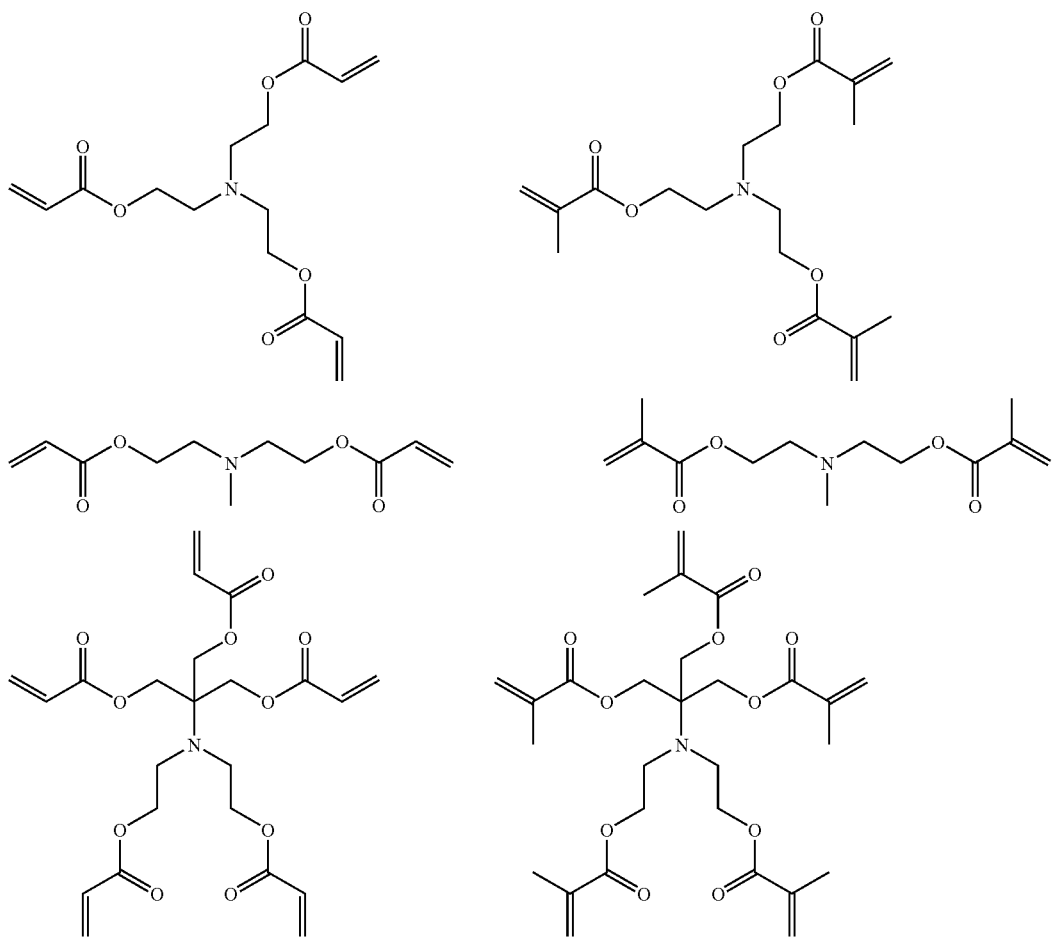

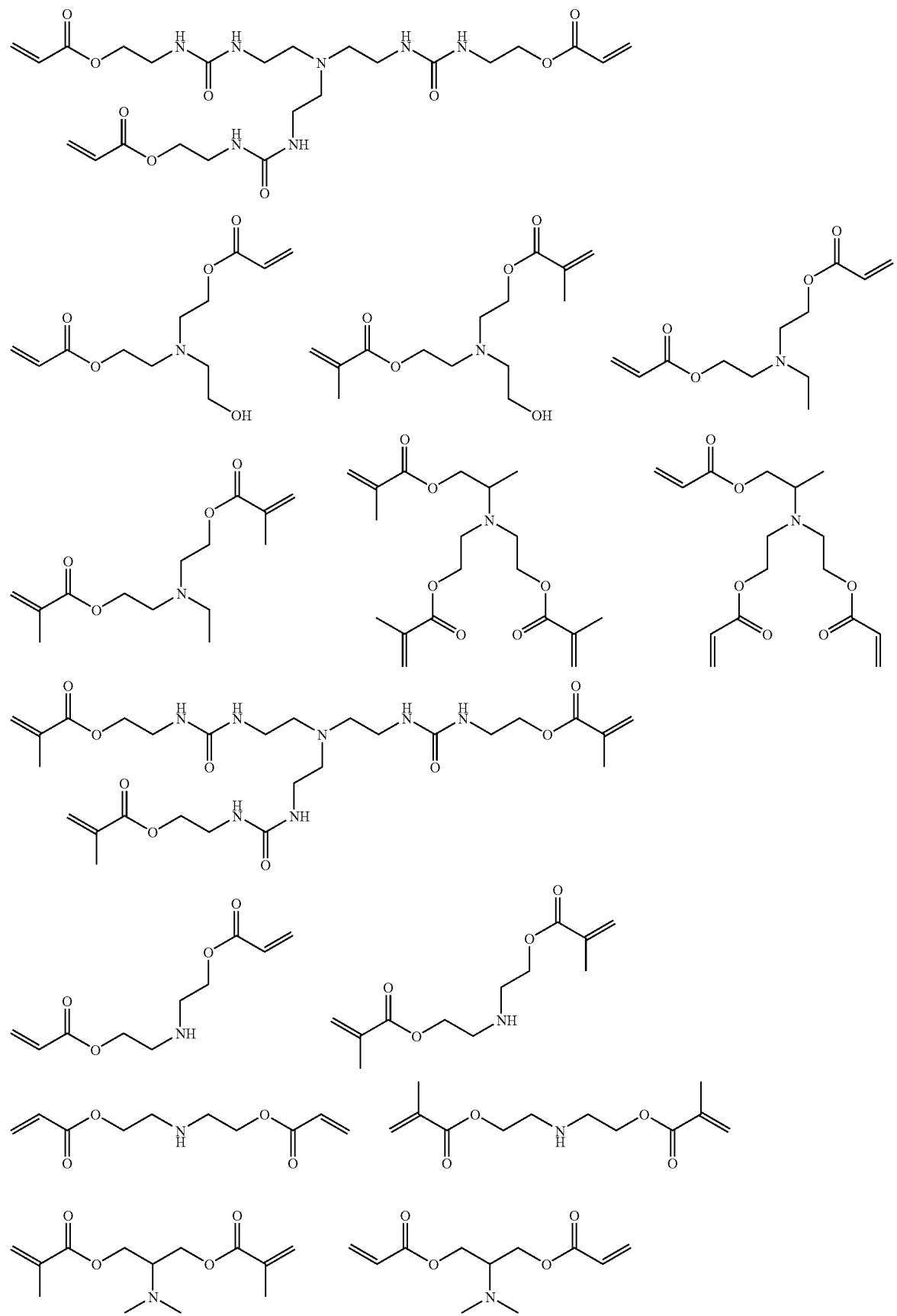

-continued
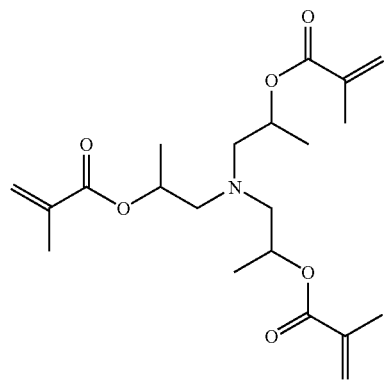
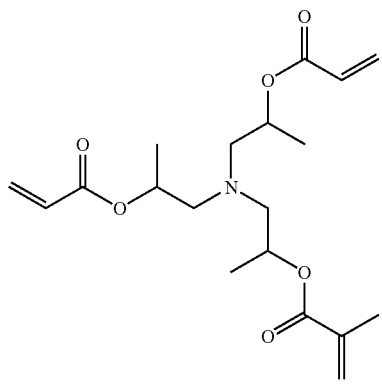
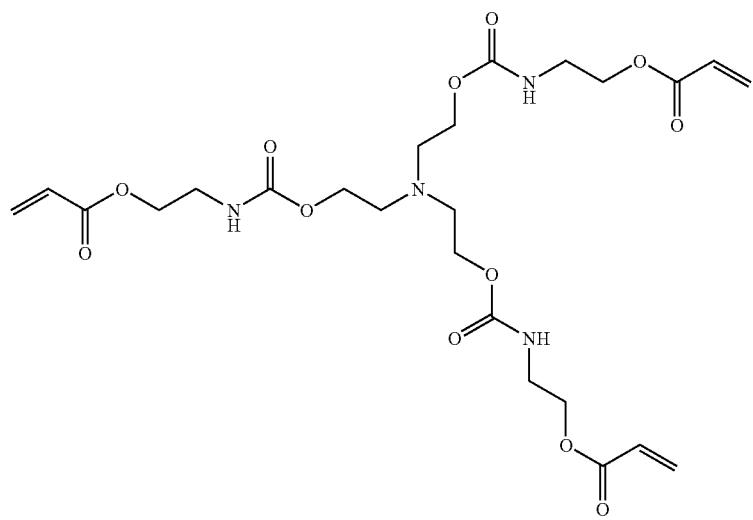
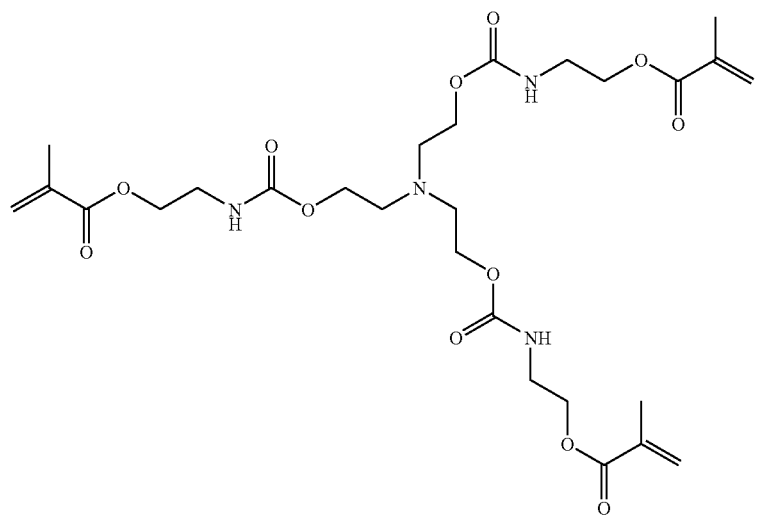
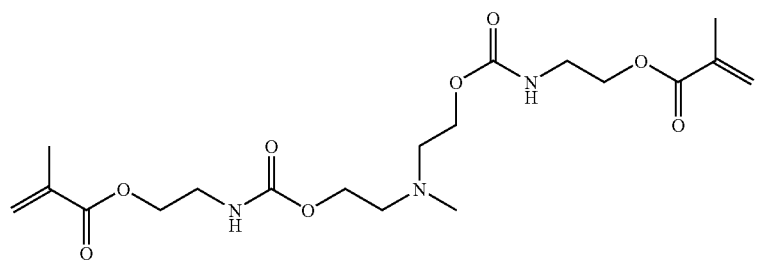

-continued
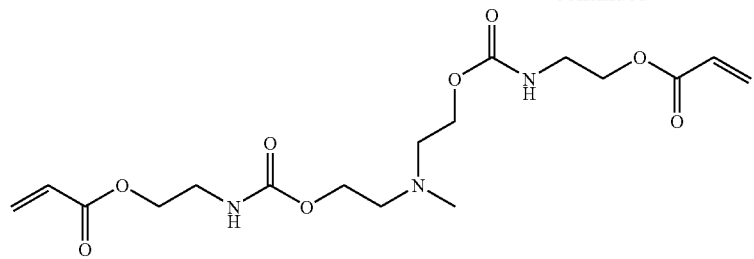
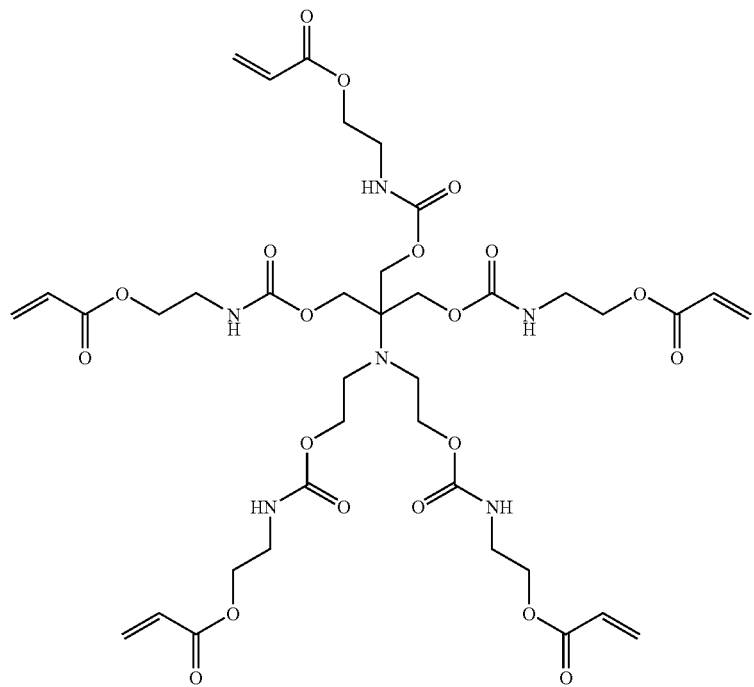
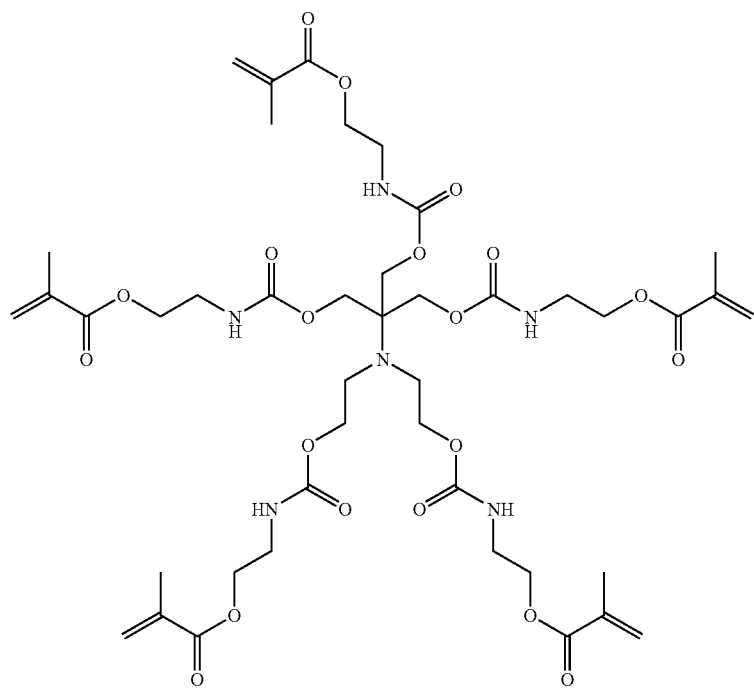

-continued

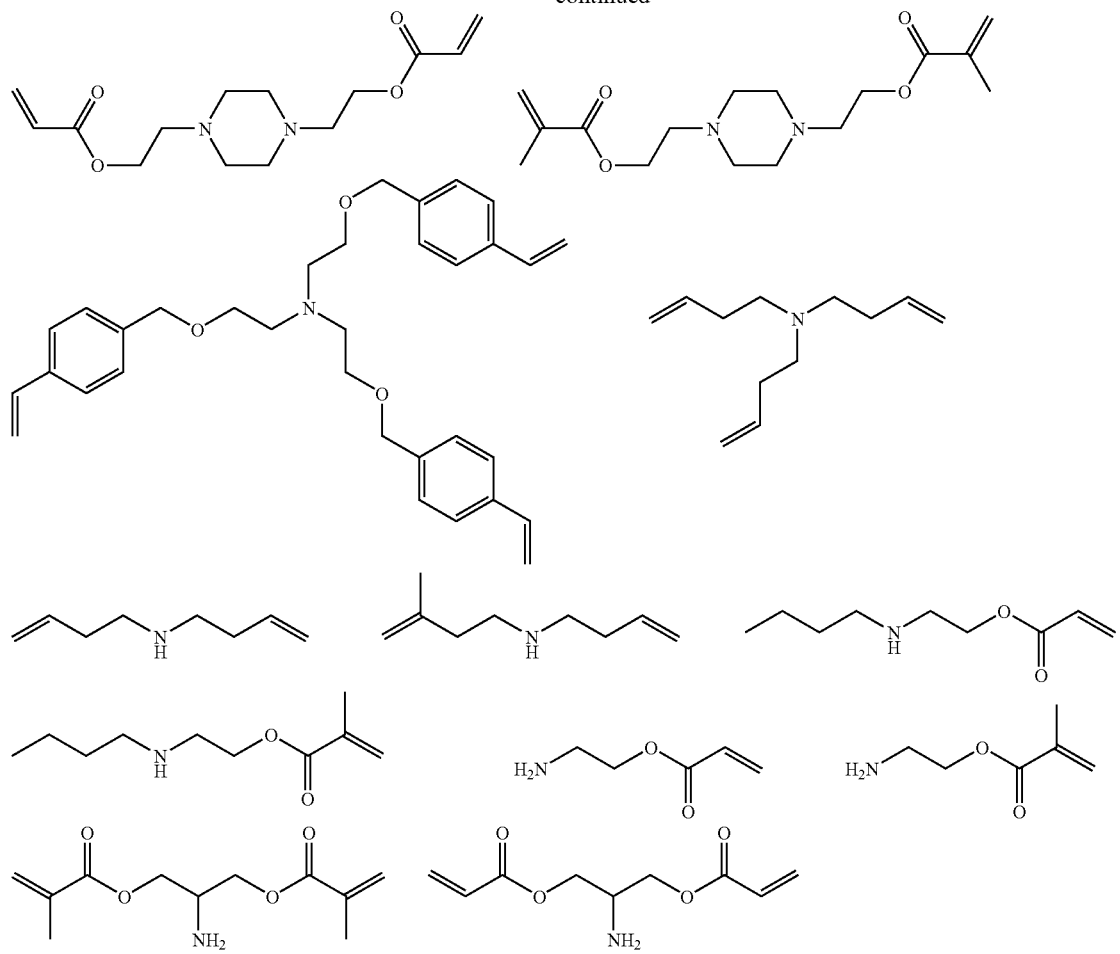

In the present invention, the "photopolymerizable compound containing an amine structure" is preferably a compound represented by Formula (1) in which all of X, Y and Z are an alkyleneoxycarbonyl group and two or more of A, B or C are a terminal group including an ethylenic unsaturated double bond; more preferably, a compound represented by Formula (1) in which all of X, Y and Z are an alkyleneoxycarbonyl group and two or more of A, B or C are a substituted or non-substituted alkenyl group having 2 to 10 carbon atoms (more preferably 2 to 4 carbon atoms); and particularly preferably a compound represented by Formula (1) in which all of X, Y and Z are an ethyleneoxycarbonyl group and all of A, B and C are a substituted or non-substituted alkenyl group having 2 to 10 carbon atoms (more preferably 2 to 4 carbon atoms).

The content amount of the photopolymerizable compound having an amine structure in the dye-containing negative curable composition is preferably from 1 to 60 mass %, more preferably from 10 to 50 mass %, and particularly preferably from 20 to 40 mass %, with respect to the total solid content of the composition. When the content of the photopolymerizable compound is 1 mass % or more, polymerization and curing can be favorably performed, distortion of the cured pattern caused by heat treatment conducted after exposure and development can be suppressed, and adhesion of the pattern to a substrate can be improved. When the content of the photopolymerizable compound is 60 mass % or less, it is advantageous to attain favorable developability at a non-exposed portion.

The dye-containing negative curable composition of the present invention may contain a known polymerizable momomer other than the photopolymerizable compound containing an amine structure, as long as the effects of the invention is not impaired.

Examples of the polymerizable monomer that may be used in the present invention include: monofunctional acrylates and methacrylates (hereinafter, referred to as (meth)acrylates) such as polyethylene glycol mono(meth)acrylate, polypropylene glycol mono(meth)acrylate and phenoxyethyl (meth)acrylate; polyethylene glycol di(meth)acrylate, trimethylol ethane tri(meth)acrylate, neopentyl glycol di(meth) acrylate, pentaerythritol tri(meth)acrylate, pentaerythritol tetra(meth)acrylate, dipentaerythritol penta(meth)acrylate, dipentaerythritol hexa(meth)acrylate, hexanediol(meth) acrylate, trimethylol propane tri(acryloyloxypropyl)ether, tri (acryloyloxyethyl)isocyanurate; compounds that have been (meth)acrylated after addition of ethylene oxide or propylene oxide to polyfunctional alcohol such as glycerin or trimethylolethane; urethane acrylates such as those described in JP-B Nos. 48-41708 and 50-6034 and JP-A No. 51-37193; polyester acrylates described in JP-A No. 48-64183 and JP-B Nos. 49-43191 and 52-30490; and polyfunctional acrylates and methacrylates, and mixtures thereof, such as epoxy acrylates that are the product of a reaction between an epoxy resin and (meth)acrylic acid. Further examples include the substances presented as photocurable monomers and oligomers in the

*Journal of the Adhesion Society of Japan*, Vol. 20, No. 7, pp. 300-308. Polyfunctional (meth)acrylic compounds are preferable as the polymerizable monomer used in the present invention.

The following are preferable combinations of (A) a dye that is soluble in an organic solvent, (B) a photopolymerization initiator, and (C) photopolymerizable compound having an amine structure, in view of suppressing distortion of a pattern caused by a heat treatment that is conducted after patterning (exposure and development).

<1> A combination in which at least one dye (A) is an acidic dye and/or a derivative thereof, and at least one photopolymerizable compound (C) is a compound represented by Formula (1) (more preferably, two or more of A, B or C include an ethylenic unsaturated double bond).

<2> A combination in which at least one dye (A) is an acidic dye and/or a derivative thereof, at least one photopolymerization initiator (B) is an oxime compound, and at least one photopolymerizable compound (C) is a compound represented by Formula (1) (more preferably, two or more of A, B or C include an ethylenic unsaturated double bond).

<3> A combination in which at least one dye (A) is an acidic dye and/or a derivative thereof, the content of the at least one dye (A) with respect to the total solid content of the composition is from 40 to 90 mass %, and at least one photopolymerizable compound (C) is a compound represented by Formula (1) (more preferably, two or more of A, B or C include an ethylenic unsaturated double bond).

<4> A combination in which at least one dye (A) is an acidic dye and/or a derivative thereof, the content of the at least one dye (A) with respect to the total solid content of the composition is from 40 to 90 mass %, at least one photopolymerization initiator (B) is an oxime compound, and at least one photopolymerizable compound (C) is a compound represented by Formula (1) (more preferably, two or more of A, B or C include an ethylenic unsaturated double bond).

<5> A combination in which at least one dye (A) is an acidic dye and/or a derivative thereof, the content of the at least one dye (A) with respect to the total solid content of the composition is from 40 to 90 mass %, at least one photopolymerization initiator (B) is an oxime compound, and at least one photopolymerizable compound (C) is a compound represented by Formula (1) in which all of X, Y and Z are an alkyleneoxycarbonyl group and two or more of A, B or C include an ethylenic unsaturated double bond.

(D) Organic Solvent

The dye-containing negative curable compound of the present invention includes at least one kind of organic solvent. Organic solvents that may be used in the present invention are not particularly limited as long as the solubility of respective components and the coating properties of the negative curable composition are satisfied; however, the organic solvent is preferably selected after consideration of the solubility, coating properties and safety of the dye and binder in particular.

Preferable examples of the organic solvent include esters such as ethyl acetate, n-butyl acetate, isobutyl acetate, amyl formate, isoamyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, alkyl 3-oxypropionates such as methyl 3-oxypropionate and ethyl 3-oxypropionate, including methyl 3-methoxypropionate, ethyl 3-methoxypropionate, methyl 3-ethoxypropionate, ethyl 3-ethoxypropionate, and the like; alkyl 2-oxypropionates such as methyl 2-oxypropionate, ethyl 2-oxypropionate and propyl 2-oxypropionate, including methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, and the like; methyl pyruvate, ethyl pyruvate, propyl pyruvate, methyl acetoacetate, ethyl acetoacetate, methyl 2-oxobutanate, ethyl 2-oxobutanate, ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, ketones such as methyl ethyl ketone, cyclohexanone, 2-heptanone, 3-heptanone, and the like; and aromatic hydrocarbons such as toluene, xylene and the like.

In view of the solubility of the dye (when a binder is included, the solubility of the binder), improvement of the surface conditions and the like, two or more of these organic solvents may be used in combination. In particular, a mixed solution composed of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate may be favorably used.

The amount of organic solvent used in the present invention is preferably 5 to 80 mass % with respect to the total solid content of the negative curable composition of the present invention, more preferably 5 to 60 mass %, and particularly preferably 10 to 50 mass % in view of coating properties.

(E) Other Components

The dye-containing negative curable composition of the present invention may include other components such as an alkali-soluble binder or a crosslinking agent, as long as the effect of the invention is not impaired.

Alkali-Soluble Binder

Known binders may be used as the binder in the present invention without particular limitation as long as these are alkali-soluble; however, the binder is preferably selected in view of heat resistance, developability, availability and the like.

Preferable alkali-soluble binders include a linear organic high-molecular polymer that is soluble in an organic solvent and that can be used in development in a weak alkali aqueous solution. Examples of the linear organic high-molecular polymer include polymers having a carboxyl group in a side chain, such as the methacrylic acid copolymers, acrylic acid copolymers, itaconic acid copolymers, crotonic acid copolymers, maleic acid copolymers, partially-esterified maleic acid copolymers and the like described in, for example, JP-A Nos. 59-44615, 59-53836 and 59-71048 and JP-B Nos. 54-34327, 58-12577 and 54-25957 and, similarly, acidic cellulose derivatives having a carboxyl group in a side chain may be used effectively.

Further, polymers having a hydroxyl group to which an acid anhydride has been added, polyhydroxystyrene resins, polysiloxane resins, poly(2-hydroxyethyl(meth)acrylate), polyvinyl pyrrolidone, polyethylene oxide, polyvinyl alcohol or the like may be used effectively as the binder for the present invention.

The linear organic high-molecular polymer may be a copolymer using a monomer having hydrophilicity, examples of which include alkoxyalkyl(meth)acrylate, hydroxyalkyl (meth)acrylate, glycerol(meth)acrylate, (meth)acrylamide, N-methylol acrylamide, secondary or tertiary alkyl acrylamide, dialkyl aminoalkyl(meth)acrylate, morpholine(meth) acrylate, N-vinyl pyrrolidone, N-vinyl caprolactam, vinyl imidazole, vinyl triazole, methyl(meth)acrylate, ethyl(meth) acrylate, branched or straight-chain propyl(meth)acrylate, branched or straight-chain butyl(meth)acrylate, and phenoxy hydroxypropyl(meth)acrylate.

In addition, monomers that include a tetrahydrofurfuryl group, a phosphoric acid group, a phosphoric acid ester group, a quaternary ammonium salt group, an ethyleneoxy chain, a propyleneoxy chain, a sulfonic acid group and a group derived from a salt of a sulfonic acid group, a morpholinoethyl group, and the like may be effectively used as the monomer having hydrophilicity.

The alkali-soluble binder used in the present invention may have a polymerizable group in a side chain in order to improve cross-linking efficiency and, for example, polymers containing an allyl group, a (meth)acryloyl group, an allyloxyalkyl group or the like in a side chain may be effectively used. Examples of the polymers containing a polymerizable group include the commercial products KS Resist 106 (manufactured by Osaka Organic Chemical Industry Ltd.) and the Cyclomer-P series (manufactured by Daicel Chemical Industries, Ltd.). Further, an alcohol-soluble nylon, a polyether formed from 2,2-bis-(4-hydroxyphenyl)-propane and epichlorohydrin, or the like may be effectively used in order to increase the strength of the cured film.

Among these binders, polyhydroxystyrene resins, polysiloxane resins, acrylic resins, acrylamide resins, and acrylic/acrylamide copolymer resins are preferable in view of heat resistance, and acrylic resins, acrylamide resins, and acrylic/acrylamide copolymer resins are preferable in view of developability control.

Copolymers formed from monomers selected from, for example, benzyl(meth)acrylate, (meth)acrylic acid, hydroxyethyl(meth)acrylate and (meth)acrylamide, or the commercial products KS Resist 106 (manufactured by Osaka Organic Chemical Industry Ltd.), the Cyclomer-P series (manufactured by Daicel Chemical Industries, Ltd.) or the like are preferable as the above acrylic resins.

In view of developability, liquid viscosity and the like, a polymer having a weight-average molecular weight (being a polystyrene equivalent value measured by the GPC method) of from 1000 to $2 \times 10^5$ is preferable, a polymer having a weight-average molecular weight of from 2000 to $1 \times 10^5$ is more preferable, and a polymer having a weight-average molecular weight of from 5000 to $5 \times 10^4$ is particularly preferable as the binder.

Cross-Linking Agent

In the present invention, a cross-linking agent may be used to obtain a more highly cured film. The cross-linking agent is explained in the following.

The cross-linking agent that may be used in the present invention is not particularly limited as long as film it can perform curing by means of the cross-linking reaction, and examples thereof include (a) an epoxy resin, (b) a melamine compound, guanamine compound, glycoluril compound or urea compound substituted by at least one selected from a methylol group, an alkoxymethyl group and an acyloxymethyl group, and (c) a phenol compound, naphthol compound, or hydroxyanthracene compound substituted by at least one selected from a methylol group, an alkoxymethyl group and an acyloxymethyl group. Among these, a polyfunctional epoxy resin is particularly preferable.

The above (a) epoxy resin may be any epoxy resin as long as it has an epoxy group and a cross-linking property. Examples thereof include: bivalent glycigyl group-containing low-molecular compounds such as bisphenol A diglycidyl ether, ethylene glycol diglycidyl ether, butanediol diglycidyl ether, hexanediol diglycidyl ether, dihydroxy biphenyl diglycidyl ether, phthalic acid diglycidyl ester or N,N-diglycidyl aniline; trivalent glycidyl group-containing low-molecular compounds represented by trimethylol propane triglycidyl ether, trimethylol phenol triglycidyl ether, TrisP-PA triglycidyl ether or the like; quadrivalent glycidyl group-containing low-molecular compounds represented by pentaerythritol tetraglycidyl ether, tetramethylol bisphenol A tetraglycidyl ether, or the like; polyvalent glycidyl group-containing low-molecular compounds such as dipentaerythritol pentaglycidyl ether, or dipentaerythritol hexaglycidyl ether; and glycidyl group-containing high-molecular compounds represented by polyglycidyl (meth)acrylate, 1,2-epoxy-4-(2-oxylanyl)cyclohexane added with 2,2-bis(hydroxymethyl)-1-butanol, or the like.

The number of sites substituted by a methylol group, alkoxymethyl group or acyloxymethyl group in the above cross-linking agent (b) is preferably from 2 to 6 in a melamine compound and from 2 to 4 in a glycoluryl compound, guanamine compound or urea compound, and is more preferably from 5 to 6 in a melamine compound and from 3 to 4 in a glycoluryl compound, guanamine compound or urea compound.

In the following, the melamine compound, guanamine compound, glycoluril compound and urea compound of (b) above are collectively referred to as the compound according to (b) (a compound containing a methylol group, alkoxymethyl group or acyloxymethyl group).

The compound containing a methylol group according to (b) can be obtained by heating the compound containing an alkoxymethyl group according to (b) in alcohol in the presence of an acid catalyst such as hydrochloric acid, sulfuric acid, nitric acid or methanesulphonic acid. The compound containing an acyloxymethyl group according to (b) can be obtained by mixing and stirring the compound containing a methylol group according to (b) with acyl chloride in the presence of a basic catalyst.

Specific examples of the above compound having a substituent group according to (b) are given in the following.

Examples of the melamine compound include hexamethylol melamine, hexamethoxymethyl melamine, a compound in which 1 to 5 methylol groups in hexamethylol melamine have been methoxymethylated and mixtures thereof, hexmethoxyethyl melamine, hexaacyloxymethyl melamine, a compound in which 1 to 5 methylol groups in hexamethylol melamine have been acyloxymethylated and mixtures thereof.

Examples of the guanamine compound include tetramethylol guanamine, tetramethoxy methyl guanamine, a compound in which 1 to 3 methylol groups in tetramethylol guanamine have been methoxymethylated, mixtures thereof, tetrakmethoxy ethyl guanamine, tetraacyloxy methyl guanamine, a compound in which 1 to 3 methylol groups in tetramethylol guanamine have been acyloxymethylated, and mixtures thereof.

Examples of the glycoluryl compound include tetramethylol glycoluryl, tetramethoxy methyl glycoluryl, a compound in which 1 to 3 methylol groups in tetramethylol glycoluryl have been methoxymethylated, mixtures thereof, a compound in which 1 to 3 methylol groups in tetramethylol glycoluryl have been acyloxymethylated, and mixtures thereof.

Examples of the urea compound include tetramethylol urea, tetramethoxy methyl urea, a compound in which 1 to 3 methylol groups in tetramethylol urea have been methoxymethylated, mixtures thereof, and tetramethoxy ethyl urea.

These compounds according to (b) may be used singly or in combination.

The above cross-linking agent (c), that is, the phenol compound, naphthol compound or hydroxyanthracene compound substituted by at least one selected from a methylol group, an alkoxymethyl group and an acyloxymethyl group, suppresses intermixing of a film with an overcoated photoresist, and also further increases the strength of the film, as a result of heat cross-linking, similarly to the above cross-linking agent (b). In the following, these compounds are collectively referred to as the compound (a compound containing a methylol group, alkoxymethyl group or acyloxymethyl group) according to (c).

The number of methylol groups, alkoxymethyl groups and acyloxymethyl groups included in the above cross-linking agent (c) needs to be at least two per molecule, and when a phenol compound forms the skeleton, a compound having both second and fourth positions substituted by these substituents is preferable in view of heat crosslinkability and storage stability.

Further, when a naphthol compound or hydroxyanthracene compound forms the skeleton, a compound having all ortho and para positions with respect to the OH group substituted by these substituents is preferable.

In the phenol compound, the third and fifth positions either may not be substituted or may have a substituent.

In the naphthol compound, positions other than the ortho positions with respect to the OH group either may not be substituted or may have a substituent.

The compound containing a methylol group according to (c) can be obtained by using as a precursor a compound in which the second or fourth position with respect to the phenolic OH group is a hydrogen atom, and reacting this with formalin in the presence of a basic catalyst such as sodium hydroxide, potassium hydroxide, ammonia or tetra-alkyl ammonium hydroxide.

The compound containing an alkoxymethyl group according to (c) can be obtained by heating the compound containing a methylol group according to (c) in the presence of an acid catalyst such as hydrochloric acid, sulfuric acid, nitric acid or methanesulphonic acid.

The compound containing an acyloxymethyl group according to (c) can be obtained by reacting the compound containing a methylol group according to (c) with acyl chloride in the presence of a basic catalyst.

Examples of the skeleton compound in the cross-linking agent (c) include a phenol, naphthol, or an hydroxyanthracene compound having either the ortho position or the para position with respect to the phenolic OH group not substituted and, for example, isomers of phenol or cresol, 2,3-xylenol, 2,5-xylenol, 3,4-xylenol, 3,5-xylenol, bisphenols such as bisphenol A, 4,4'-bishydroxybiphenyl, TrisP-PA (manufactured by Honshu Chemical Industry Co., Ltd.), naphthol, dihydroxynaphthalene, 2,7-dihydroxyanthracene or the like, may be used.

Specific examples of the cross-linking agent (c) include, as the phenol compound or the naphthol compound, trimethylol phenol, tri(methoxymethyl)phenol, a compound in which 1 or 2 methylol groups in trimethylol phenol have been methoxymethylated, trimethylol-3-cresol, tri(methoxymethyl)-3-cresol, a compound in which 1 or 2 methylol groups in trimethylol-3-cresol have been methoxymethylated, dimethylol cresols such as 2,6-dimethylol-4-cresol, tetramethylol bisphenol A, tetra(methoxymethyl)bisphenol A, a compound in which 1 to 3 methylol groups in tetramethylol bisphenol A have been methoxymethylated, tetramethylol-4,4'-dihydroxybiphenyl, tetramethoxymethyl-4,4'-dihydroxybiphenyl, hexamethylol derivatives of TrisP-PA, hexamethoxymethyl derivatives of TrisP-PA, a compound in which 1 to 5 methylol groups in a hexamethylol derivatives of TrisP-PA have been methoxymethylated, and bishydroxymethyl naphthalene diol.

Further, examples of the hydroxyanthracene compound include 1,6-di(hydroxymethyl)-2,7-dihydroxyanthracene, and examples of the compound containing an acyloxymethyl group include a compound in which either some or all of the methylol groups in the above compound containing a methylol group have been acyloxymethylated.

Preferable examples of these compounds include trimethylol phenol, bishydroxymethyl-p-cresol, tetramethylol bisphenol A, hexamethylol derivatives of TrisP-PA (manufactured by Honshu Chemical Industry Co., Ltd.), and phenol compounds in which all or some of the methylol groups in any of these compounds are substituted by alkoxymethyl groups.

These compounds according to (c) may be used either singly or in combination thereof.

The cross-linking agent may not necessarily be used in the present invention. When the crosslinking agent is used, the total content thereof in the dye-containing negative curable composition of the present invention differs according to the material, but is preferably 1-70 mass %, more preferably 5-50 mass % and particularly preferably 7-30 mass % with respect to the solid content (mass) of the curable composition, in view of improving curability.

Thermal Polymerization Inhibitor

In addition to the above, the dye-containing negative curable composition of the present invention preferably also includes a thermal polymerization inhibitor. For example, hydroquinone, p-methoxy phenol, di-t-butyl-p-cresol, pyrogallol, t-butyl cathecol, benzoquinone, 4,4'-thiobis(3-methyl-6-t-butylphenol), 2,2'-methylenebis(4-methyl-6-t-butylphenol), or 2-mercapto benzoimidazole may be used.

Other Additives

Various additives such as fillers, high-molecular compounds other than the alkali-soluble binders described above, surfactants, adhesion promoters, antioxidants, ultraviolet absorbers, and anticoagulants may be incorporated into the dye-containing negative curable composition of the present invention as necessary.

Specific examples of the above additives include fillers such as glass and alumina; high-molecular compounds other than the aforementioned binders, such as polyvinyl alcohol, polyacrylic acid, polyethylene glycol monoalkyl ether and polyfluoroalkyl acrylate; nonionic, cationic and anionic surfactants, and the like; adhesion promoters such as vinyl trimethoxysilane, vinyl triethoxysilane, vinyl tris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropyl methyl dimethoxysilane, 2-(3,4-epoxycyclohexyl)ethyl trimethoxysilane, 3-chloropropyl methyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butyl phenol; ultraviolet absorbers such as 2-(3-t-butyl-5-methyl-2-hydroxyphenyl)-5-chlorobenzotriazole and alkoxybenzophenone; and anticoagulants such as sodium polyacrylate.

Further, an organic carboxylic acid, preferably a low-molecular organic carboxylic acid having a molecular weight of 1000 or less, can be added to the dye-containing negative curable composition of the present invention in order to promote the alkali solubility of the non-exposed portion and further improve the developability of the composition.

Specific examples include aliphatic monocarboxylic acids such as formic acid, acetic acid, propionic acid, butyric acid, valeric acid, pivalic acid, caproic acid, diethyl acetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenyl acetic acid, hydratropic acid, hydrocinnamic acid, mandelic acid, phenylsuccinic acid, atropic acid, cinnamic acid, cinnamylidene acetic acid, coumaric acid, and umbellic acid.

The dye-containing negative curable composition of the present invention may be suitably used in the formation of a colored pixel such as a color filter used in liquid display devices (LCD), solid-state image sensors (such CCD and CMOS) and the like.

The dye-containing negative curable composition of the present invention is particularly suitable for a color filter used in solid-state image sensors for which formation of a thin film of fine-sized colored pattern with a favorable rectangular profile is demanded.

When the pattern size of a pixel for a color filter is 2 μm or less (in a length of a pixel pattern in a direction of normal line to a substrate) (for example, 0.5 μm to 2.0 μm), color irregularities may be easily caused due to the presence of coarse particles of a pigment, or distortion upon heat treatment conducted after patterning may be easily caused due to a relatively small amount of a component that contributes to photolithographic properties, as a result of increasing the amount of a dye. These problems are particularly significant when the pattern size is 1.0 μm to 1.7 μm (in particular, 1.2 μm to 1.5 μm). Moreover, when the film thickness is 1 μm or less, the amount of a component that contributes to photolithographic properties relatively decreases as the amount of a colorant increases, thereby causing reduction in resolution, promoting exfoliation of a pattern in a low-exposed region, or causing distortion upon heat treatment after patterning. These problems are particularly significant when the film thickness is 0.005 μm to 0.9 μm (in particular, 0.1 μm to 0.7 μm).

When the dye-containing negative curable composition of the present invention is used in the formation of a color filter for solid-state image sensors, a pattern having an almost rectangular shape with suppressed tapering due to distortion by heat can be obtained. Further, a pattern with enhanced sensitivity and improved adhesion to a substrate, which may prevent exfoliation of the pattern to suppress occurrence of image defects, can be obtained.

Color Filter and Method of Production Thereof

Next, the color filter of the present invention is described in detail by means of a description of the method of production thereof.

The dye-containing negative curable composition of the present invention described in the foregoing is used in the method of producing a color filter of the present invention.

By using the dye-containing negative curable composition of the present invention, a color filter provided with heat resistance can be formed. Accordingly, a color filter composed of fine-sized pattern having high sensitivity with little distortion caused by heat treatment can be formed. Moreover, a color filter with an improved adhesion to a substrate or the like, thereby suppressing occurrence of exfoliation (image defects), can be obtained.

The method of producing a color filter of the present invention includes applying the dye-containing negative curable composition onto a substrate to form a film, exposing the formed film to light through a mask, and developing the film to form a pattern.

Specifically, the color filter can be suitably produced by applying the dye-containing negative curable composition of the present invention onto a support by a coating method such as spin coating, flow coating or roll coating to form a radiation-sensitive composition layer, exposing the formed layer via a given mask pattern, and developing the exposed layer with a developer to form a negative color pattern. As necessary, a process of curing the formed color pattern by heating and/or further exposure may be included in the method of the present invention.

In the production of a color filter, a color filter composed of intended hues can be produced by repeating the above image formation process (and, as necessary, the curing process) for the number of times corresponding to the number of intended hues. Ultraviolet rays such as g-line, h-line and i-line are preferably used as the light or radiation.

Exposure of the negative curable composition of the present invention may be performed by any of proximity exposure, mirror projection exposure or stepper exposure, but it is particularly preferable to perform exposure according to the stepper method (a reduced projection exposure method using a reduced projection exposure device). The stepper method forms a pattern by performing exposure while gradually varying the exposure amount, and the rectangularity of the pattern can be made particularly favorable in this method. As an exposure device used in the stepper exposure, an i-line stepper (product name: FPA-3000i5+; manufactured by Canon Inc.) or the like may be used.

Examples of the above support include soda glass, borosilicate glass (such as Pyrex (registered trademark) glass) and silica glass and the like with a transparent conductive film formed thereon, which are used in liquid crystal display elements and the like; photoelectrical conversion element substrates used in image sensors and the like, such as a silicon substrate or the like; and complementary metal oxide film semiconductors (CMOS). In certain cases, these substrates may be formed with black stripes separating respective pixels.

Further, an undercoating layer may be provided on these supports, as necessary, for the purpose of improved adhesiveness with the upper layer, prevention of diffusion of materials, and planarization of the substrate surface.

Any developer may be used as long as it is formed of a composition that dissolves an uncured portion of the negative curable composition of the present invention but does not dissolve an irradiated portion. Specifically, combinations of various organic solvents or alkaline aqueous solutions may be used. Examples of the organic solvents include the organic solvents described above that are used in preparing the dye-containing negative curable composition of the present invention.

Favorable examples of the alkaline aqueous solution include alkaline aqueous solutions formed by dissolving alkaline compounds such as sodium hydroxide, potassium hydroxide, sodium carbonate, sodium silicate, sodium metasilicate, ammonia water, ethylamine, diethylamine, dimethyl ethanol amine, tetramethyl ammonium hydroxide, tetraethyl ammonium hydroxide, choline, pyrrole, piperidine and 1,8-diazabicyclo-[5.4.0]-7-undecene, to a density of from 0.001 to 10 mass %, preferably from 0.01 to 1 mass %. In addition, when a developer formed from this kind of alkaline aqueous solution is used, washing with water is generally performed after development.

The color filter of the present invention can be used in liquid crystal display elements and solid state image sensors such as CCDs and, in particular, is favorably used in high-resolution CCDs, CMOSs and the like having more than one million pixels. The color filter of the present invention can be used, for example, as a color filter disposed between the light receiving portion of respective pixels configuring a CCD and a microlens for focusing light.

The color filter of the present invention may have a colored pattern with favorable rectangularity formed by using the dye-containing negative curable composition of the present invention. Moreover, a solid-state image sensor provided with this color filter can exhibit excellent color reproducibility.

The configuration of the solid-state image sensor is not particularly limited as long as the solid-state image sensor is provided with the color filter of the present invention and functions as a solid-state image sensor, but one example thereof is that including plural photodiodes that constitute a light-receiving area of a CCD and a transfer electrode formed from polysilicone or the like; a light-shielding film formed from tungsten or the like, having an opening at a position corresponding to the light-receiving area of the photodiodes; and a device protection film formed from silicon nitride or the like, formed to cover the whole area of the light-shielding film and the light-receiving area of the photodiodes; and the color filter of the present invention, in this order from a substrate.

Further, a light-harvesting means (such as a microlens) may be provided between the aforementioned device protection film and the color filter, or on the top of the color filter.

The following are exemplary embodiments of the present invention.

<1> A dye-containing negative curable composition comprising at least a dye soluble in an organic solvent, a photopolymerization initiator, a photopolymerizable compound containing an amine structure, and an organic solvent.

<2> The dye-containing negative curable composition of <1>, wherein the photopolymerizable compound containing an amine structure has a tertiary amine structure.

<3> The dye-containing negative curable composition of <1>, wherein the photopolymerizable compound containing an amine structure is represented by the following Formula (1):

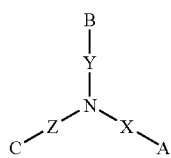

Formula (1)

wherein in Formula (1), X, Y and Z each independently represent a divalent linking group containing an alkylene group to be bonded to the nitrogen atom or a single bond; A, B and C each independently represent a monovalent terminal group; and at least one of A, B or C contains an ethylenic unsaturated double bond.

<4> The dye-containing negative curable composition of <3>, wherein all of X, Y and Z are an alkylene oxycarbonyl group.

<5> The dye-containing negative curable composition of <3>, wherein at least two of A, B and C contain an ethylenic unsaturated double bond.

<6> The dye-containing negative curable composition of <3>, wherein at least two of A, B or C are a substituted or non-substituted alkenyl group having 2 to 10 carbon atoms.

<7> The dye-containing negative curable composition of <3>, wherein all of X, Y and Z are an alkylene oxycarbonyl group, and at least two of A, B or C contain an ethylenic unsaturated double bond.

<8> The dye-containing negative curable composition of <3>, wherein all of X, Y and Z are an alkylene oxycarbonyl group, and at least two of A, B or C are a substituted or non-substituted alkenyl group having 2 to 10 carbon atoms.

<9> The dye-containing negative curable composition of <3>, wherein all of A, B and C contain an ethylenic unsaturated double bond.

<10> The dye-containing negative curable composition of <1>, wherein the content of the photopolymerizable compound containing an amine structure with respect to the total solid content of the dye-containing negative curable composition is from 1 to 60 mass %.

<11> The dye-containing negative curable composition of <1>, wherein the dye soluble in an organic solvent comprises an acidic dye.

<12> The dye-containing negative curable composition of <1>, wherein the content of the dye soluble in an organic solvent with respect to the total solid content of the dye-containing negative curable composition is 40 mass % or more.

<13> The dye-containing negative curable composition of <1>, wherein the photopolymerization initiator comprises an oxime compound.

<14> The dye-containing negative curable composition of <1>, wherein the composition is used for forming a color filter for a solid-state image sensor.

<15> A color filter for a solid-state image sensor, formed from the dye-containing negative curable composition of <1>.

<16> A method of forming a color filter, comprising:
applying the dye-containing negative curable composition of <1> onto a substrate;
exposing the film formed from the dye-containing negative curable composition to light through a mask; and
forming a pattern by developing the exposed film.

<17> A solid-state image sensor comprising the color filter of <15>.

EXAMPLES

In the following, the present invention is explained in further detail using examples; however, the present invention is not limited to the following examples as long as it does not exceed the main essence of the invention. In addition, unless otherwise indicated, "parts" and "percent" refer to the mass standard.

Example 1

1) Preparation of Dye-Containing Negative Curable Composition

The following compounds were mixed and dissolved according to the composition indicated, and the dye-containing negative curable composition of the present invention was prepared.

Composition

| | |
|---|---|
| Cyclohexanone (organic solvent) | 26 g |
| Resin A (alkali-soluble binder) (Copolymer of benzyl methacrylate and methacrylic acid (at a molar ratio of 80/20)) | 2.0 g |
| Monomer containing an amine structure A (photopolymerizable compound) (represented by the following structure) | 3.0 g |
| Oxime A (photopolymerization initiator) (2-(O-benzoyloxime)-1-[4-(phenylthio)phenyl]-1,2-octanedione (manufactured by Ciba Japan, K.K.) | 1.0 g |
| Dye soluble in organic solvent (Valifast yellow 1101) | 4.0 g |

2) Production of Glass Substrate with Undercoat Layer Applied Thereon

A resist solution (product name: CT-2000L; manufactured by FUJIFILM Electronic Materials Co., Ltd.) was applied onto a silicon substrate (water) to a thickness of 2 μm using a spincoater, and dried by heating at 220° C. for 1 hour to form a cured film (undercoat layer).

3) Exposure and Development of Dye-Containing Negative Curable Composition (Image Formation Process)

The dye-containing negative curable composition obtained in 1) above was applied onto the undercoat layer on the undercoat layer formed on the silicon substrate obtained in 2) above at a film thickness of 1 μm using a spincoater and prebaked at 100° C. for 120 seconds, to produce a sample having a colored resist layer formed on the silicon substrate.

Examples 2-17

Dye-containing negative curable compositions were prepared and samples were produced in a similar manner to Example 1, except that the respective compositions were altered with respect to Example 1 as shown in the following Table 1.

Comparative Examples 1-9

Dye-containing negative curable compositions for comparison were prepared and samples were produced in a similar manner to Example 1, except that the respective compositions included in the negative curable composition were altered with respect to Example 1 as shown in the following Table 2.

4) Evaluation

Evaluation of the samples was conducted in accordance with the following method. The results are shown in Tables 1 and 2.

(1) Sensitivity

The colored resist layer of the samples as irradiated with light at a wavelength of 365 nm through a mask of 2 μm length and 2 μm width using an i-line reduced projection exposure device with the light exposure amount varied. After irradiation, development was performed at 23° C. for 60 seconds using a 60% developer (product name: CD-2000; manufactured by FUJIFILM Electronic Materials Co., Ltd.). Subsequently, a pattern image was formed after rinsing with running water for 20 seconds and spray-drying. The obtained pattern image was observed according to a normal method using an optical microscope and SEM photography.

Here, the light exposure amount is set at an appropriate level so that the width of the pixel pattern (2 μm length and 2 μm width) and the width of the space between the pixel patterns correspond at a ratio of 1:1, and this light exposure amount is taken as an index of the sensitivity. The lower the value of the light exposure amount, the higher the sensitivity is.

(2) Profile

The shape at a cross-section of a pattern image formed at the appropriate exposure amount as defined in (1) above shown in an SEM image was observed in accordance with the following criteria. The cross-section of a pattern above refers to a cross-section cut by a plane that is normal to the silicon substrate and parallel to one side of the pattern.

<Evaluation Criteria>

A: The pattern profile has a favorable rectangular shape, described as (A) in FIG. 1.

B: The pattern profile has a shape in which corners not in contact with the substrate are slightly round described as (B) in FIG. 1, but is acceptable in practical use.

C: The pattern profile has a round-top shape in which corners not in contact with the substrate are significantly round, described as (C) in FIG. 1.

D: The pattern profile has a significant round-top shape, described as (D) in FIG. 1.

(3) Adhesion Sensitivity

Using the pattern image obtained in a similar manner to (1) above, a minimum level of light exposure amount in which no exfoliation occurred was taken as an index of the adhesion sensitivity. The smaller the value of the minimum light exposure amount, the more favorable the adhesion sensitivity is.

TABLE 1

| | Alkali-soluble Binder | Photopolymerizable monomer | Organic solvent-soluble dye | Photopolymerization initoator | Organic solvent | Sensitivity (mJ/cm²) | Profile | Adhesion sensitivity (mJ/cm²) |
|---|---|---|---|---|---|---|---|---|
| Example 1 | Resin A (2.0 g) | Amine-containing Monomer A (3.0 g) | Varifast Yellow 1101 (4.0 g) | Oxime A (1.0 g) | Cyclohexanone (26 g) | 400 | A | 100 |
| Example 2 | Resin A (2.0 g) | Amine-containing Monomer B (3.0 g) | Varifast Yellow 1101 (4.0 g) | Oxime A (1.0 g) | Cyclohexanone (26 g) | 300 | A | 80 |
| Example 3 | Resin A (2.0 g) | Amine-containing Monomer C (3.0 g) | Varifast Yellow 1101 (4.0 g) | Oxime A (1.0 g) | Cyclohexanone (26 g) | 250 | A | 50 |
| Example 4 | Resin A (1.5 g) | Amine-containing Monomer A (2.7 g) | Varifast Yellow 1101 (5.0 g) | Oxime A (0.8 g) | Cyclohexanone (26 g) | 500 | A | 150 |
| Example 5 | Resin A (1.5 g) | Amine-containing Monomer B (2.7 g) | Varifast Yellow 1101 (5.0 g) | Oxime A (0.8 g) | Cyclohexanone (26 g) | 400 | A | 120 |
| Example 6 | Resin A (1.5 g) | Amine-containing Monomer C (2.7 g) | Varifast Yellow 1101 (5.0 g) | Oxime A (0.8 g) | Cyclohexanone (26 g) | 300 | A | 100 |
| Example 7 | Resin A (1.0 g) | Amine-containing Monomer A (2.4 g) | Varifast Yellow 1101 (6.0 g) | Oxime A (0.6 g) | Cyclohexanone (26 g) | 650 | A | 300 |
| Example 8 | Resin A (1.0 g) | Amine-containing Monomer B (2.4 g) | Varifast Yellow 1101 (6.0 g) | Oxime A (0.6 g) | Cyclohexanone (26 g) | 500 | A | 200 |

TABLE 1-continued

|  | Alkali-soluble Binder | Photopolymerizable monomer | Organic solvent-soluble dye | Photopolymerization initoator | Organic solvent | Sensitivity (mJ/cm$^2$) | Profile | Adhesion sensitivity (mJ/cm$^2$) |
|---|---|---|---|---|---|---|---|---|
| Example 9 | Resin A (1.0 g) | Amine-containing Monomer C (2.4 g) | Varifast Yellow 1101 (6.0 g) | Oxime A (0.6 g) | Cyclohexanone (26 g) | 450 | A | 280 |
| Example 10 | Resin A (1.0 g) | Amine-containing Monomer A (2.4 g) | Varifast Yellow 1101 (3.0 g) Acid Red 57 (3.0 g) | Oxime A (0.6 g) | Cyclohexanone (26 g) | 650 | A | 300 |
| Example 11 | Resin A (1.0 g) | Amine-containing Monomer B (2.4 g) | Varifast Yellow 1101 (3.0 g) Acid Red 57 (3.0 g) | Oxime A (0.6 g) | Cyclohexanone (26 g) | 500 | A | 200 |
| Example 12 | Resin A (1.0 g) | Amine-containing Monomer C (2.4 g) | Varifast Yellow 1101 (3.0 g) Acid Red 57 (3.0 g) | Oxime A (0.6 g) | Cyclohexanone (26 g) | 450 | A | 280 |
| Example 13 | Resin A (1.0 g) | Amine-containing Monomer A (2.4 g) | Varifast Yellow 1101 (3.0 g) Acid Red 57 (3.0 g) | Oxime B (0.6 g) | Cyclohexanone (26 g) | 480 | A | 220 |
| Example 14 | Resin A (1.0 g) | Amine-containing Monomer B (2.4 g) | Varifast Yellow 1101 (3.0 g) Acid Red 57 (3.0 g) | Oxime B (0.6 g) | Cyclohexanone (26 g) | 350 | A | 150 |
| Example 15 | Resin A (1.0 g) | Amine-containing Monomer C (2.4 g) | Varifast Yellow 1101 (3.0 g) Acid Red 57 (3.0 g) | Oxime B (0.6 g) | Cyclohexanone (26 g) | 250 | A | 200 |
| Example 16 | Resin A (1.0 g) | Amine-containing Monomer D (2.4 g) | Varifast Yellow 1101 (4.0 g) | Oxime A (1.0 g) | Cyclohexanone (26 g) | 680 | A | 300 |
| Example 17 | Resin A (1.0 g) | Amine-containing Monomer E (2.4 g) | Varifast Yellow 1101 (4.0 g) | Oxime A (1.0 g) | Cyclohexanone (26 g) | 700 | A | 300 |

TABLE 2

|  | Alkali-soluble Binder | Photopolymerizable monomer | Organic solvent-soluble dye | Photopolymerization initoator | Organic solvent | Sensitivity (mJ/cm$^2$) | Profile | Adhesion sensitivity (mJ/cm$^2$) |
|---|---|---|---|---|---|---|---|---|
| Comparative Example 1 | Resin A (2.0 g) | Monomer a (3.0 g) | Varifast Yellow 1101 (4.0 g) | Oxime A (1.0 g) | Cyclohexanone (26 g) | 400 | B | 300 |
| Comparative Example 2 | Resin A (2.0 g) | Monomer b (3.0 g) | Varifast Yellow 1101 (4.0 g) | Oxime A (1.0 g) | Cyclohexanone (26 g) | 400 | C | 350 |
| Comparative Example 3 | Resin A (1.5 g) | Monomer a (2.7 g) | Varifast Yellow 1101 (5.0 g) | Oxime A (0.8 g) | Cyclohexanone (26 g) | 500 | C | 400 |
| Comparative Example 4 | Resin A (1.5 g) | Monomer b (2.7 g) | Varifast Yellow 1101 (5.0 g) | Oxime A (0.8 g) | Cyclohexanone (26 g) | 500 | C | 450 |
| Comparative Example 5 | Resin A (1.0 g) | Monomer a (2.4 g) | Varifast Yellow 1101 (6.0 g) | Oxime A (0.6 g) | Cyclohexanone (26 g) | 800 | D | 500 |
| Comparative Example 6 | Resin A (1.0 g) | Monomer b (2.4 g) | Varifast Yellow 1101 (6.0 g) | Oxime A (0.6 g) | Cyclohexanone (26 g) | 720 | D | 650 |
| Comparative Example 7 | Resin A (1.0 g) | Monomer a (2.4 g) | Varifast Yellow 1101 (3.0 g) Acid Red 57 (3.0 g) | Oxime A (0.6 g) | Cyclohexanone (26 g) | 800 | D | 500 |
| Comparative Example 8 | Resin A (1.0 g) | Monomer b (2.4 g) | Varifast Yellow 1101 (3.0 g) Acid Red 57 (3.0 g) | Oxime A (0.6 g) | Cyclohexanone (26 g) | 720 | D | 650 |
| Comparative Example 9 | Resin A (1.5 g) | Monomer c (2.7 g) | Varifast Yellow 1101 (5.0 g) | Oxime A (0.8 g) | Cyclohexanone (26 g) | 450 | C | 350 |

The respective abbreviations in Tables 1 and 2 indicate the following.
(Alkali-soluble resin (resin A))
Benzylmethacrylate/methacrylic acid copolymer (molar ratio: 80/20)
(Photopolymerizable compound)

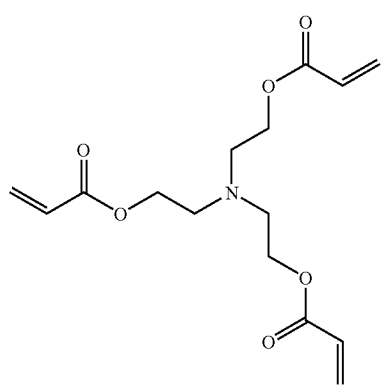

Amine-containing Monomer A

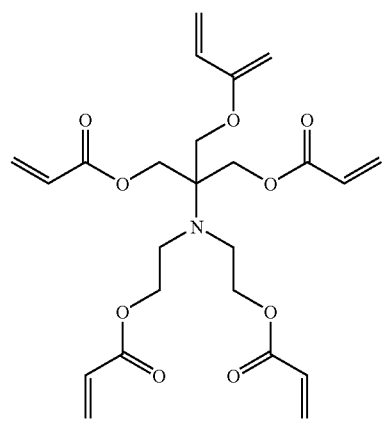

Amine-containing Monomer B

-continued

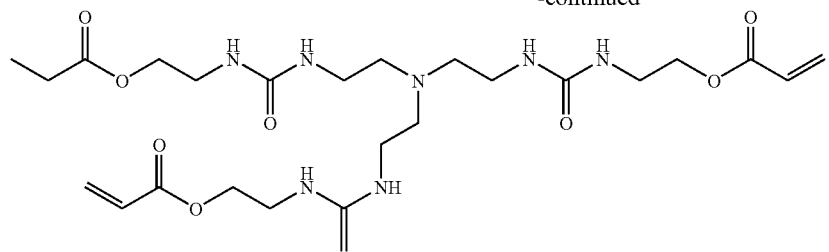

Amine-containing Monomer C

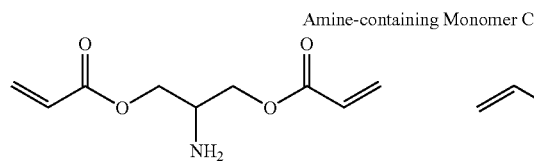

Amine-containing Monomer D                Amine-containing Monomer E

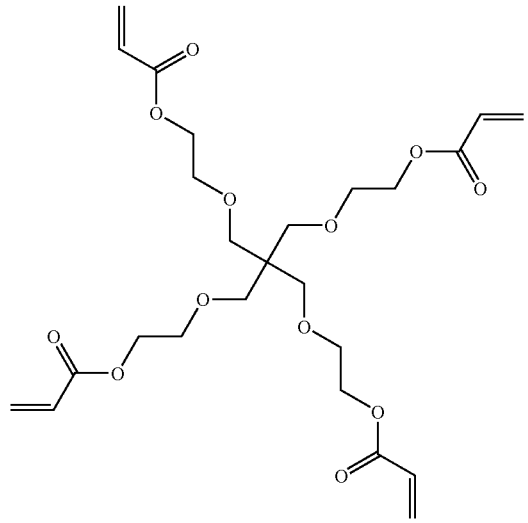

Monomer a

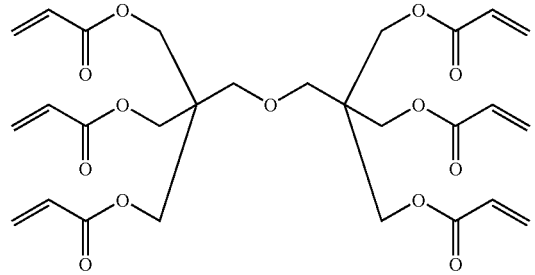

Monomer b

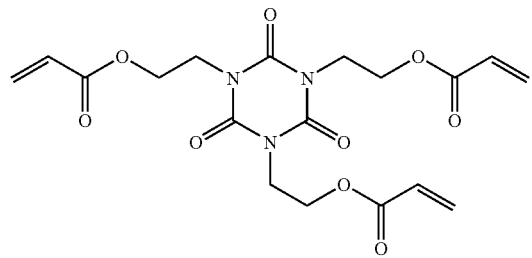

Monomer c (Photopolymerization initiator)
Oxime A: 2-(O-benzoyloxime)-1-[4-(phenylthio)phenyl]-1,2-octanedione (manufactured by Ciba Japan, K.K.)
Oxime B: 1-(O-acetyloxime)-1-[9-ethyl-6-(2-methylbenzoyl)-9H-carbazol-3-yl]ethanone (manufactured by Ciba Japan, K.K.)

In the above Examples and Comparative Examples, a yellow color filter was formed on a silicon substrate. However, a color filter having three colors of RGB can be obtained by using dye-containing negative curable compositions in which the dye is changed to respective colors of R, G and B, and repeating the process as described above for a number of times corresponding to respective colors.

Further, a solid-state image sensor can be formed by changing the silicon substrate to a substrate having a photodiode, light-shielding film, device protection film or the like formed thereon. Specifically, for example, a solid-state image sensor can be obtained by preparing a substrate having photodiodes and a transfer electrode formed thereon, forming a light-shielding film made of tungsten having an opening corresponding to a light-receiving portion of the photodiodes on the substrate, forming a device protection film made of silicon nitride on the light-shielding film so as to cover the whole area of the light-shielding film and the light-receiving portion of the photodiode, forming a color filter on the device protection by a method similar to Examples 1 to 17, and then forming a microlens as a light collector on the color filter. The solid-state image sensor thus obtained can exhibit favorable color reproducibility.

All publications, patent applications, and technical standards mentioned in this specification are herein incorporated by reference to the same extent as is each individual publication, patent application, or technical standard was specifically and individually indicated to be incorporated by reference.

What is claimed is:

1. A dye-containing negative curable composition comprising a dye soluble in an organic solvent, a photopolymerization initiator, a photopolymerizable compound containing an amine structure, and an organic solvent, wherein a content of the dye with respect to a total solid content of the dye-containing negative curable composition is from 40 mass % to 80 mass %.

2. The dye-containing negative curable composition of claim 1, wherein the photopolymerizable compound containing an amine structure has a tertiary amine structure.

3. The dye-containing negative curable composition of claim 1, wherein the photopolymerizable compound containing an amine structure is represented by the following Formula (1):

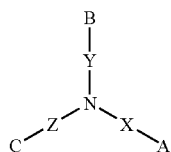

Formula (1)

wherein in Formula (1), X, Y and Z each independently represent a divalent linking group containing an alkylene group to be bonded to the nitrogen atom, or a single bond;

A, B and C each independently represent a monovalent terminal group; and at least one of A, B or C contains an ethylenic unsaturated double bond.

4. The dye-containing negative curable composition of claim 3, wherein all of X, Y and Z are an alkylene oxycarbonyl group.

5. The dye-containing negative curable composition of claim 3, wherein at least two of A, B or C contain an ethylenic unsaturated double bond.

6. The dye-containing negative curable composition of claim 3, wherein at least two of A, B or C are a substituted or non-substituted alkenyl group having 2 to 10 carbon atoms.

7. The dye-containing negative curable composition of claim 3, wherein all of X, Y and Z are an alkylene oxycarbonyl group, and at least two of A, B or C contain an ethylenic unsaturated double bond.

8. The dye-containing negative curable composition of claim 3, wherein all of X, Y and Z are an alkylene oxycarbonyl group, and at least two of A, B or C are a substituted or non-substituted alkenyl group having 2 to 10 carbon atoms.

9. The dye-containing negative curable composition of claim 3, wherein all of A, B and C contain an ethylenic unsaturated double bond.

10. The dye-containing negative curable composition of claim 1, wherein the content of the photopolymerizable compound containing an amine structure with respect to the total solid content of the dye-containing negative curable composition is from 1 mass % to 60 mass %.

11. The dye-containing negative curable composition of claim 1, wherein the dye soluble in an organic solvent comprises an acidic dye.

12. The dye-containing negative curable composition of claim 1, wherein the photopolymerization initiator comprises an oxime compound.

13. The dye-containing negative curable composition of claim 1, wherein the composition is used for forming a color filter for a solid-state image sensor.

14. A color filter for a solid-state image sensor, formed from the dye-containing negative curable composition of claim 1.

15. A method of forming a color filter, comprising:
applying the dye-containing negative curable composition of claim 1 onto a substrate;
exposing the film formed from the dye-containing negative curable composition to light through a mask; and
forming a pattern by developing the exposed film.

16. A solid-state image sensor comprising the color filter of claim 14.

17. The dye-containing negative curable composition of claim 10, wherein the content of the photopolymerizable compound containing an amine structure with respect to the total solid content of the dye-containing negative curable composition is from 20 mass % to 40 mass %.

* * * * *